(12) United States Patent
Harada et al.

(10) Patent No.: US 8,253,142 B1
(45) Date of Patent: Aug. 28, 2012

(54) SOLID-STATE IMAGING DEVICE AND METHOD OF FABRICATING THE SAME

(75) Inventors: Kouichi Harada, Kanagawa (JP);
Yasuhiro Ueda, Kanagawa (JP);
Nobuhiko Umezu, Kanagawa (JP);
Kazushi Wada, Kanagawa (JP);
Yoshinori Toumiya, Kanagawa (JP);
Takeshi Matsuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/649,570

(22) Filed: Aug. 28, 2000

(30) Foreign Application Priority Data

Aug. 27, 1999 (JP) .................................. P11-214706

(51) Int. Cl.
*H01L 27/14* (2006.01)

(52) U.S. Cl. .......... 257/72; 257/291; 257/292; 257/293; 257/294; 257/E31.127

(58) Field of Classification Search .................... 257/72, 257/291–294, 414, 432
See application file for complete search history.

(56) References Cited

U.S. PATENT DOCUMENTS

| 4,581,622 | A | * | 4/1986 | Takasaki et al. ................ 357/23 |
| 4,731,881 | A | * | 3/1988 | Geller ........................... 455/619 |
| 4,966,831 | A | * | 10/1990 | Medra et al. ................... 430/321 |
| 5,239,179 | A | * | 8/1993 | Baker ........................ 250/338.4 |
| 5,371,397 | A | * | 12/1994 | Maegawa et al. ............. 257/432 |
| 5,384,231 | A | * | 1/1995 | Johnson et al. ............... 430/321 |
| 5,514,888 | A | * | 5/1996 | Sano et al. .................... 257/232 |
| 5,614,950 | A | * | 3/1997 | Park et al. ..................... 348/315 |
| 5,637,894 | A | * | 6/1997 | Hori et al. ..................... 257/249 |
| 5,844,290 | A | * | 12/1998 | Furumiya ..................... 257/432 |
| 5,986,704 | A | * | 11/1999 | Asai et al. ..................... 348/340 |
| 6,064,069 | A | * | 5/2000 | Nakano et al. ........... 250/370.08 |
| 6,066,511 | A | * | 5/2000 | Fukusyo ......................... 438/60 |
| 6,069,350 | A | * | 5/2000 | Ohtsuka et al. ............. 250/208.1 |
| 6,104,021 | A | * | 8/2000 | Ogawa ........................ 250/208.1 |
| 6,147,390 | A | * | 11/2000 | Nakano et al. ................ 257/437 |
| 6,171,883 | B1 | * | 1/2001 | Fan et al. ....................... 438/65 |
| 6,252,219 | B1 | * | 6/2001 | Abe ............................ 250/208.1 |
| 6,259,083 | B1 | * | 7/2001 | Kimura ..................... 250/208.1 |
| 6,271,103 | B1 | * | 8/2001 | Lee .............................. 438/464 |
| 6,362,498 | B2 | * | 3/2002 | Abramovich ................. 257/233 |
| 6,379,993 | B1 | * | 4/2002 | Nakano et al. .................. 438/75 |
| 6,569,703 | B1 | * | 5/2003 | Fukusho ......................... 438/60 |
| 6,614,479 | B1 | * | 9/2003 | Fukusho et al. ............. 348/340 |
| 2001/0033007 | A1 | * | 10/2001 | Lee ............................... 257/432 |

(Continued)

FOREIGN PATENT DOCUMENTS

JP 57-211268 * 12/1982

(Continued)

*Primary Examiner* — A. Sefer
(74) *Attorney, Agent, or Firm* — SNR Denton US LLP

(57) ABSTRACT

A solid-state imaging device includes a layer including an on-chip lens above a sensor section, and the layer including the on-chip lens is composed of an inorganic film which transmits ultraviolet light. The layer including the on-chip lens may further include a planarizing film located below the on-chip lens. A method of fabricating a solid-state imaging device includes the steps of forming a planarizing film composed of a first inorganic film, forming a second inorganic film on the planarizing film, forming a lens-shaped resist layer on the second inorganic film, and etching back the resist layer to form an on-chip lens composed of the second inorganic film. The first inorganic film constituting the planarizing film and the second inorganic film constituting the on-chip lens preferably transmit ultraviolet light.

1 Claim, 6 Drawing Sheets

U.S. PATENT DOCUMENTS

2006/0261369 A1 * 11/2006 Maruyama et al. ........... 257/184

FOREIGN PATENT DOCUMENTS

| | | | |
|---|---|---|---|
| JP | 59-182561 | * | 10/1984 |
| JP | 60-262458 | * | 12/1985 |
| JP | 2-6902 | * | 1/1990 |
| JP | 4-24964 | * | 1/1992 |
| JP | 4-226073 | * | 8/1992 |
| JP | 4-275460 | * | 10/1992 |
| JP | 5-55535 | * | 3/1993 |
| JP | 5-218372 | * | 8/1993 |
| JP | 6-45572 | * | 2/1994 |
| JP | 6-174914 | * | 6/1994 |
| JP | 6-224397 | * | 8/1994 |
| JP | 8-148665 | * | 6/1996 |
| JP | 9-90104 | * | 4/1997 |
| JP | 10-284710 | * | 10/1998 |
| JP | 11-87674 | * | 3/1999 |
| JP | 11-87675 | * | 3/1999 |
| JP | 11-223707 | * | 8/1999 |
| JP | 11-121725 | * | 11/1999 |
| KR | 10-0172849 | * | 10/1998 |
| WO | WO 90/01805 | * | 2/1990 |

* cited by examiner

SOLID-STATE IMAGING DEVICE AND METHOD OF FABRICATING THE SAME

RELATED APPLICATION DATA

The present application claims priority to Japanese Application No. P11-241706 filed Aug. 27, 1999, which application is incorporated herein by reference to the extent permitted by law.

BACKGROUND OF THE INVENTION

1. Field of the Invention

The present invention relates to a solid-state imaging device which is suitable for use, for example, as a solid-state imaging device for detecting ultraviolet light and to a method of fabricating the same.

2. Description of the Related Art

In a conventional CCD solid-state imaging device, an on-chip lens and a planarizing film underlying the on-chip lens are generally composed of organic materials. For example, a photoresist film is used for the planarizing film and the on-chip lens, and an organic material, such as casein, is used for color filters between the planarizing film and the on-chip lens.

Since the organic materials described above do not transmit ultraviolet light, the device is not sensitive to ultraviolet light.

Therefore, it is not possible to form an on-chip lens if a CCD solid-state imaging device having the conventional structure is required to be sensitive to ultraviolet light.

If the on-chip lens is not formed, since light entering an area in which a shading film is formed in the vicinity of a photosensor cannot be detected, the effective aperture ratio of the sensor section is decreased, resulting in a reduction in sensitivity.

In view of the problem described above, for example, in order to improve the sensitivity to ultraviolet light, solid-state imaging devices having structures described below have been proposed.

1. A structure in which an organic film above the sensor section is eliminated or the thickness of the organic film is significantly decreased in a conventional CCD solid-state imaging device so that ultraviolet light enters the sensor section.

2. A structure in which the thickness of the substrate side of a CCD solid-state imaging device is decreased so that light (ultraviolet light) is applied from the back surface of the substrate.

3. A structure in which a material, such as a fluorescent coating, which converts the wavelength of ultraviolet light into that of visible light is applied on the sensor section.

In the first structure described above, since ultraviolet light entering a section other than the sensor section cannot be detected, the effective aperture ratio of the sensor section is decreased. Additionally, since the sensor section is not provided with a protection film, a semiconductor layer in the sensor section is degraded unless moisture, etc. is blocked by a package or the like.

In the second structure described above, the ultraviolet light passing through the substrate is scattered and diverted to the adjacent pixels, resulting in a decrease in resolution. Additionally, since the substrate must be formed as thin as possible, as the thickness of the substrate is decreased, the fabrication cost is increased.

Moreover, since the CCD solid-state imaging device having the second structure is a frame transfer (FT) charge coupled device, in which an n-type buried channel is formed in a p-type substrate to constitute a sensor section which also acts as a transfer section, the dark current is increased. Also, an electronic shuttering behavior by draining electric charge toward the substrate is not allowed.

In the third structure, due to the slow response of the wavelength conversion from ultraviolet light into visible light, residual images easily occur.

Consequently, in the first to third structures, since it is an aim to provide sufficient sensitivity to ultraviolet light, the other characteristics have been deteriorated.

SUMMARY OF THE INVENTION

Accordingly, it is an object of the present invention to provide a solid-state imaging device having sufficient sensitivity to ultraviolet light as well as having satisfactory characteristics, such as resolution and response.

In one aspect of the present invention, a solid-state imaging device includes a layer including an on-chip lens above a sensor section, and the layer including the on-chip lens is composed of an inorganic film which transmits ultraviolet light.

The layer including the on-chip lens may further include a planarizing film located below the on-chip lens. The on-chip lens may be composed of SiN or SiO. The planarizing film may also be composed of SiN or SiO.

In another aspect of the present invention, a method of fabricating a solid-state imaging device includes the steps of forming a planarizing film composed of a first inorganic film above a sensor section, forming a second inorganic film on the planarizing film, forming a lens-shaped resist layer on the second inorganic film, and etching back the resist layer to form an on-chip lens composed of the second inorganic film.

The first inorganic film constituting the planarizing film and the second inorganic film constituting the on-chip lens preferably transmit ultraviolet light. The planarizing film may be composed of SiN or SiO. The on-chip lens may also be composed of SiN or SiO.

In accordance with the present invention, since the layer including the on-chip lens above the sensor section is composed of the inorganic film which transmits ultraviolet light, it is possible to construct a solid-state imaging device which is sensitive to ultraviolet light. Ultraviolet light entering a section other than the sensor section can be collected by the on-chip lens so as to enter the sensor section.

DESCRIPTION OF THE PREFERRED EMBODIMENTS

Figure 1:
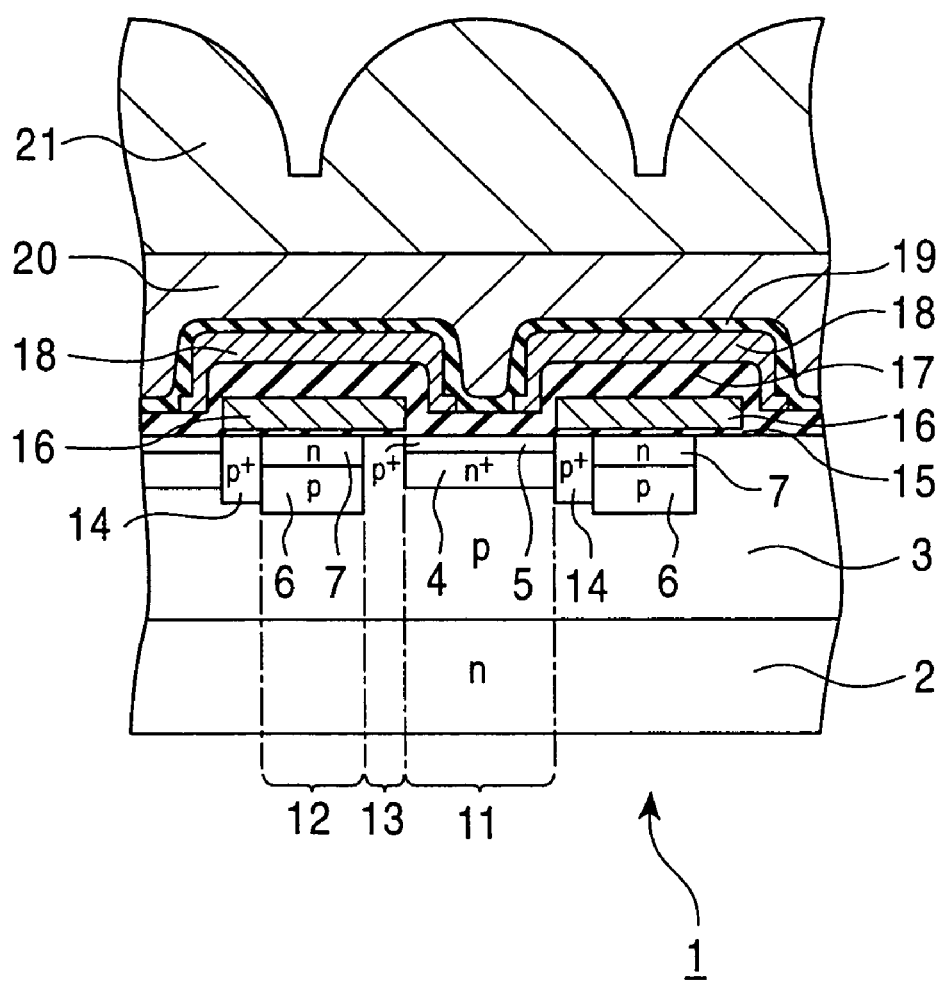
FIG. 1 is a sectional view which schematically shows a portion of a solid-state imaging device in an embodiment of the present invention.

FIG. 1 is a sectional view of a solid-state imaging device which schematically shows a portion in the vicinity of the sensor section in an embodiment of the present invention. In a solid-state imaging device 1 shown in FIG. 1, the present invention is applied to a CCD solid-state imaging device.

In the solid-state imaging device 1, a p-type semiconductor region 3 is formed on an n-type semiconductor substrate 2, and an n-type impurity region 4, a p-type positive charge storage region 5, a p-type semiconductor well region 6, an n-type transfer channel region 7, and a p-type channel stop region 14 are formed by impurity diffusion.

Among them, the n-type impurity region 4 and the positive charge storage region 5 constitute a sensor section (light-receiving section) 11, and the transfer channel region 7, the p-type semiconductor well region 6, and the transfer electrode 16 which will be described below constitute a vertical transfer resister 12 having a CCD structure.

The sensor section 11 corresponds to a pixel, and although not shown in the drawing, a plurality of the sensor sections 11 are arrayed in a matrix.

A read-out gate section 13 is formed between the sensor section 11 and the vertical transfer register 12.

The transfer electrode 16 is composed of, for example, polycrystalline silicon, and formed above the p-type semiconductor region 3 with a gate insulating film 15 therebetween. The transfer electrode 16 is formed above the read-out gate section 13, the vertical transfer register 12, and the channel stop region 14.

A shading film 18 composed of a metal film, such as aluminum (Al) or tungsten (W) is formed over the entire surface excluding the aperture of the sensor section 11 with an interlayer insulating film 17 therebetween.

A planarizing film 20 is formed on the shading film 18 with an insulating film 19 composed of, for example, an SiO$_2$ film or a borophosphosilicate glass (BPSG) film, therebetween, and an on-chip lens 21 with a curved surface in the shape of a lens is formed-thereon.

In this embodiment, in particular, the planarizing film 20 and the on-chip lens 21 are composed of SiN films formed by plasma-enhanced chemical vapor deposition (CVD).

Thereby, the planarizing film 20 and the on-chip lens 21 allow ultraviolet light to pass through. Since the insulating film 19 located therebelow is composed of the SiO$_2$ film or the like, it also transmits ultraviolet light.

Accordingly, ultraviolet light is allowed to enter the sensor section 11.

Furthermore, since an SiN film blocks mobile ions of moisture, sodium, and the like, it acts as a passivation film.

Accordingly, in this embodiment, the planarizing film 20 and the on-chip lens 21 can be also used as passivation films.

In accordance with the embodiment, since all of the insulating film 19, the planarizing film 20, and the on-chip lens 21 are composed of inorganic films which transmit ultraviolet light, ultraviolet light is allowed to enter the sensor section 11, and the device is sensitive to ultraviolet light.

Since light entering the section other than the sensor section 11 is collected by the on-chip lens 21 so as to enter the sensor section 11, the effective aperture ratio of the sensor section 11 is improved, and a quantum efficiency that is comparable with that in the structure in which ultraviolet light is applied from the back surface of the substrate can be obtained, resulting in high sensitivity.

In particular, since the planarizing film 20 and the on-chip lens 21 are composed of the SiN film having a high transmittance of ultraviolet light, the device has very high sensitivity to ultraviolet light.

Moreover, in this embodiment, the structure from the n-type semiconductor substrate 2 to the insulating film 19 disposed on the shading film 18 is the same as that in a conventional CCD solid-state imaging device using an n-type semiconductor substrate.

Therefore, it is possible to employ the same fabrication process as that of the conventional CCD solid-state imaging device using the n-type semiconductor substrate, and the solid-state imaging device 1 which is sensitive to ultraviolet light can be fabricated at low cost.

Since the semiconductor substrate 2 is formed as an n-type substrate, in a manner similar to that of the conventional CCD solid-state imaging device using the n-type semiconductor substrate, dark current and smear are decreased, and residual images do not easily occur. It is also possible to realize an electronic shuttering behavior by draining charge toward the substrate.

The solid-state imaging device 1 in this embodiment can be fabricated as described below.

The shading film 18 is patterned so as to have an aperture above the sensor section 11, and the insulating film 19 is formed thereon. Up to this step, the fabrication method is similar to that for the conventional CCD solid-state imaging device, and can be carried out at low cost.

Figure 2A:
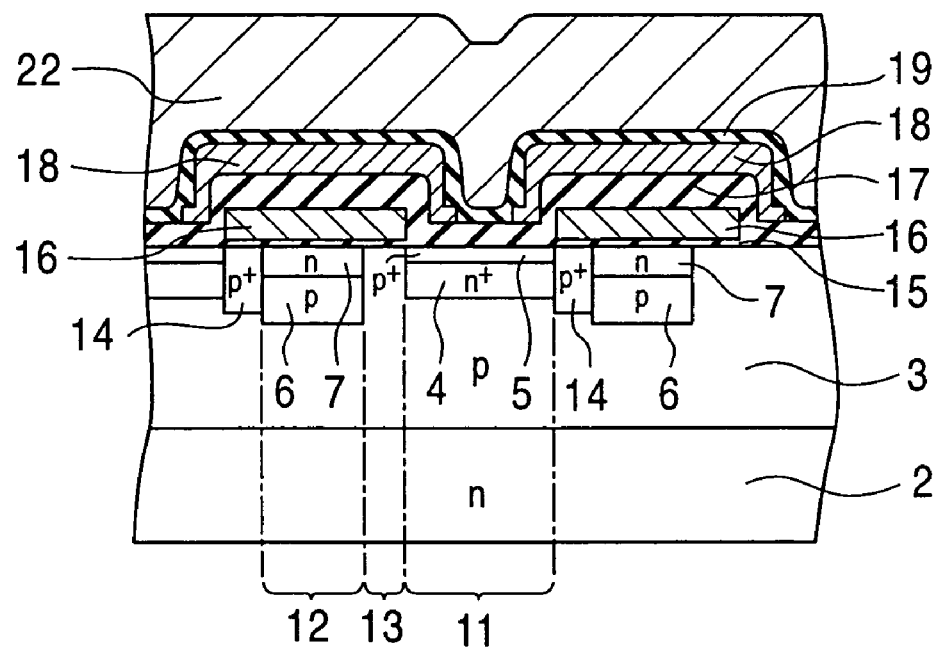
FIGS. 2A and 2B are sectional views illustrating fabrication steps of the solid-state imaging device shown in FIG. 1.

Next, as shown in FIG. 2A, a first inorganic film 22 is formed by depositing an SiN film by plasma-enhanced CVD.

The first inorganic film 22 has a concave portion on the surface above the sensor section 11 in response to the unevenness of the insulating film 19 due to the step of the transfer electrode 16.

Consequently, in order to form an on-chip lens on the first inorganic film 22, the surface of the first inorganic film 22 must be planarized.

Figure 2B:
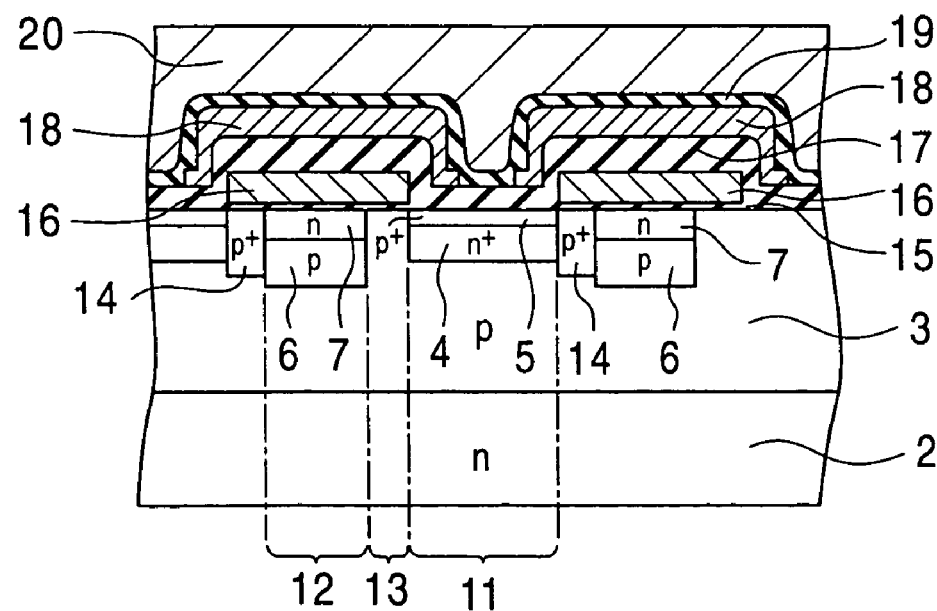

Next, as shown in FIG. 2B, by planarizing the surface of the first inorganic film 22, the planarizing film 20 composed of the SiN film is formed.

The planarization may be performed by subjecting the first inorganic film 22 to either an etch-back process or chemical mechanical polishing (CMP).

Figure 3A:
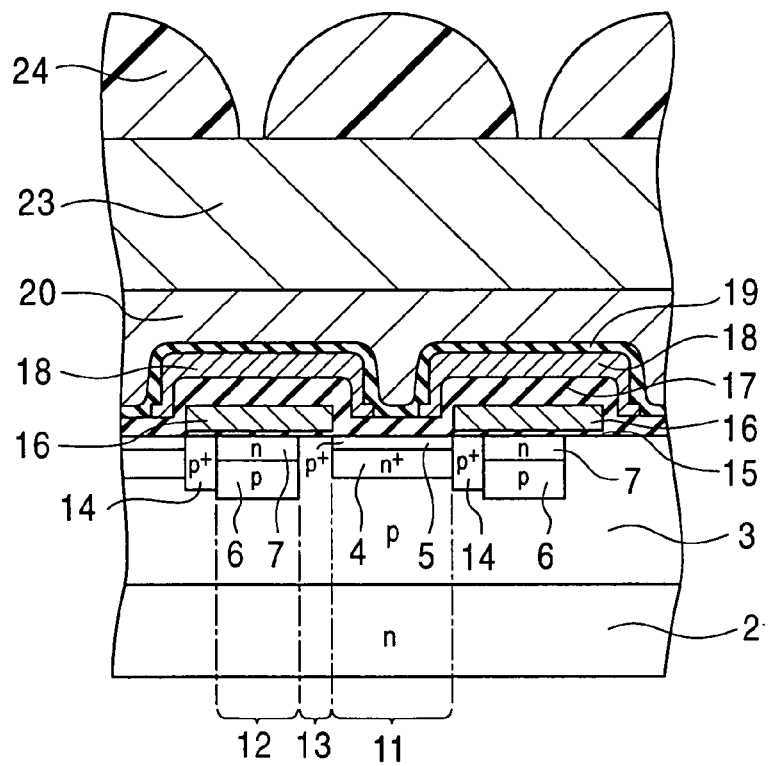
FIGS. 3A and 3B are sectional views illustrating fabrication steps of the solid-state imaging device shown in FIG. 1.

Next, as shown in FIG. 3A, a second inorganic film 23 composed of an SiN film is formed on the planarizing film 20 by plasma-enhanced CVD, and a lens-shaped resist layer 24 is formed on the surface of the second inorganic film 23.

In order to form the lens-shaped resist layer 24, after the resist layer is patterned, ref lowing is performed by heat treatment, for example, at approximately 100 to 200° C.

Figure 3B:
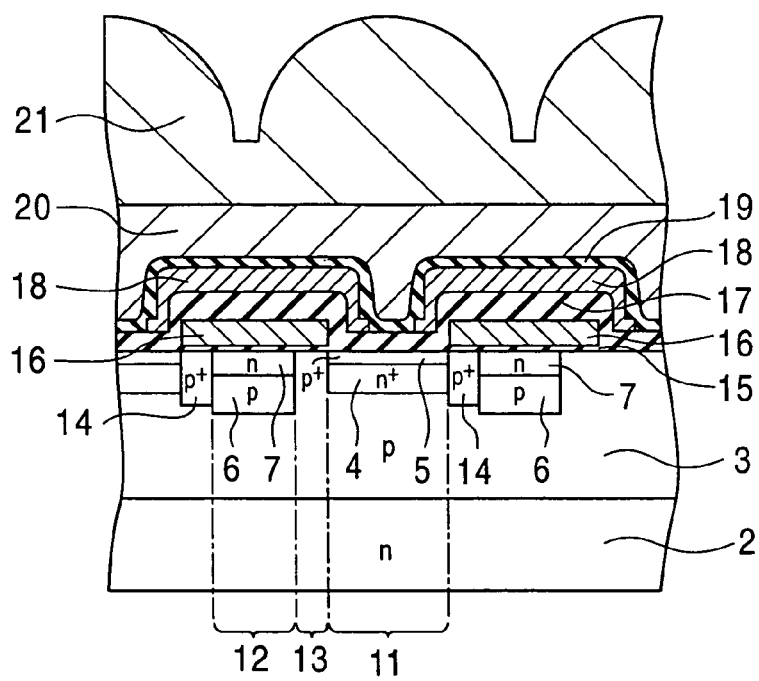

By etching back the lens-shaped resist layer 24, the shape of the lens is transferred to the second inorganic film 23, and the on-chip lens 21 composed of the SiN film with a surface shaped like the lens is formed as shown in FIG. 3B.

In this way, the solid-state imaging device 1 which is sensitive to ultraviolet light in this embodiment can be fabricated.

Figure 4:
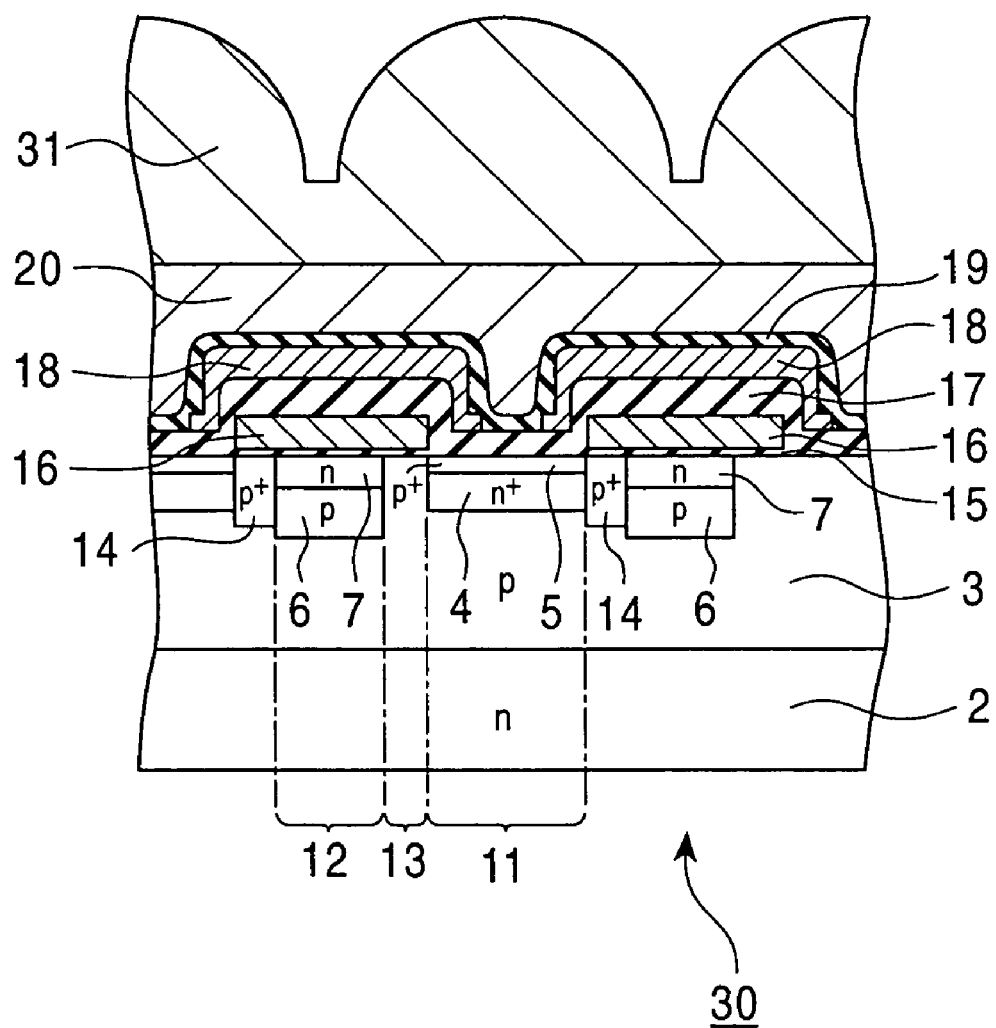
FIG. 4 is a sectional view which schematically shows a portion of a solid-state imaging device in another embodiment of the present invention.

FIG. 4 is a sectional view of a solid-state imaging device which schematically shows a portion in the vicinity of the sensor section in another embodiment of the present invention.

A solid-state imaging device 30 includes a planarizing film 20 composed of an SiN film, the same as FIG. 1, and an on-chip lens 31 composed of an SiO film formed thereon by plasma-enhanced CVD.

Since the planarizing film 20 is composed of the SiN film, the planarizing film 20 can be used as a passivation film.

Since the other structure is the same as that of the solid-state imaging device 1 shown in FIG. 1, the same numerals are used for the same components, and a description thereof will be omitted.

The SiO film formed by plasma-enhanced CVD transmits ultraviolet light having shorter wavelengths in addition to the ultraviolet light transmitted by the SiN film in the previous embodiment shown in FIG. 1.

Although the SiN film transmits substantially 100% of ultraviolet light having a wavelength of approximately 266 nm, the transmittance decreases for ultraviolet light having shorter wavelengths.

In contrast, the SiO film transmits the ultraviolet light having shorter wavelengths which the SiN film does not transmit.

Therefore, the solid-state imaging device 30 in this embodiment has a higher sensitivity also covering a shorter wavelength range in comparison with the solid-state imaging device 1 in the previous embodiment.

Figure 5:
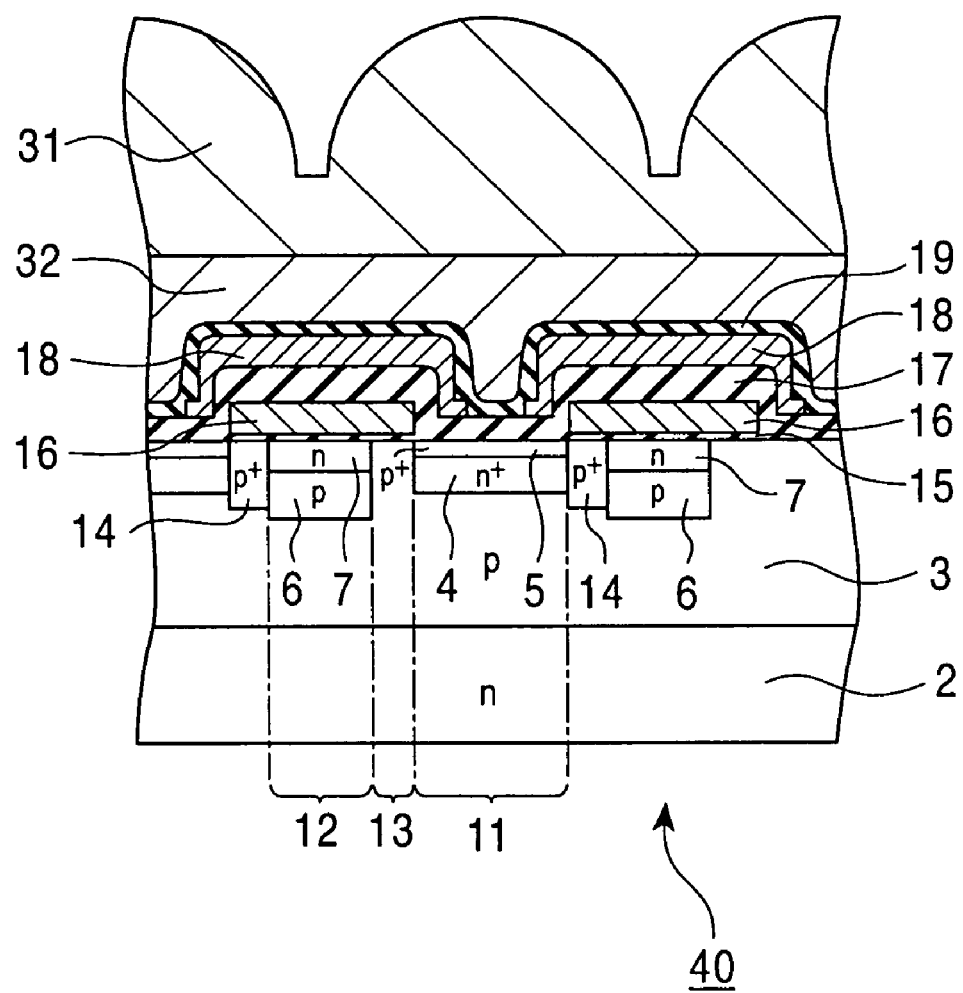
FIG. 5 is a sectional view which schematically shows a portion of a solid-state imaging device in another embodiment of the present invention.

FIG. 5 is a sectional view of a solid-state imaging device which schematically shows a portion in the vicinity of the sensor section in another embodiment of the present invention.

A solid-state imaging device 40 includes a planarizing film 32 composed of an SiO film formed by plasma-enhanced CVD on an insulating film 19, and an on-chip lens 31 composed of an SiO film formed by plasma-enhanced CVD on the planarizing film 32.

That is, in this embodiment, both the planarizing film 32 and the on-chip lens 31 are composed of the SiO film.

Since the other structure is the same as that of the solid-state imaging device 1 shown in FIG. 1, the same numerals are used for the same components, and a description thereof will be omitted.

Since the planarizing film 32 is also composed of the SiO film, the solid-state imaging device 40 in this embodiment is provided with high sensitivity to the shorter wavelength range, the same as the solid-state imaging device 30 shown in FIG. 4, and the sensitivity can be further improved by increasing the transmittance for the shorter wavelength range in comparison with the solid-state imaging device 30 shown in FIG. 4.

Additionally, since the SiO film does not have the passivating effect, such as that of the SiN film, the solid-state imaging device 40 is not provided with a film having the passivating effect.

Consequently, it is preferable that a layer for blocking moisture and mobile ions be formed on the outside of the on-chip lens 31, for example, on the package of the solid-state imaging device.

Figure 6:
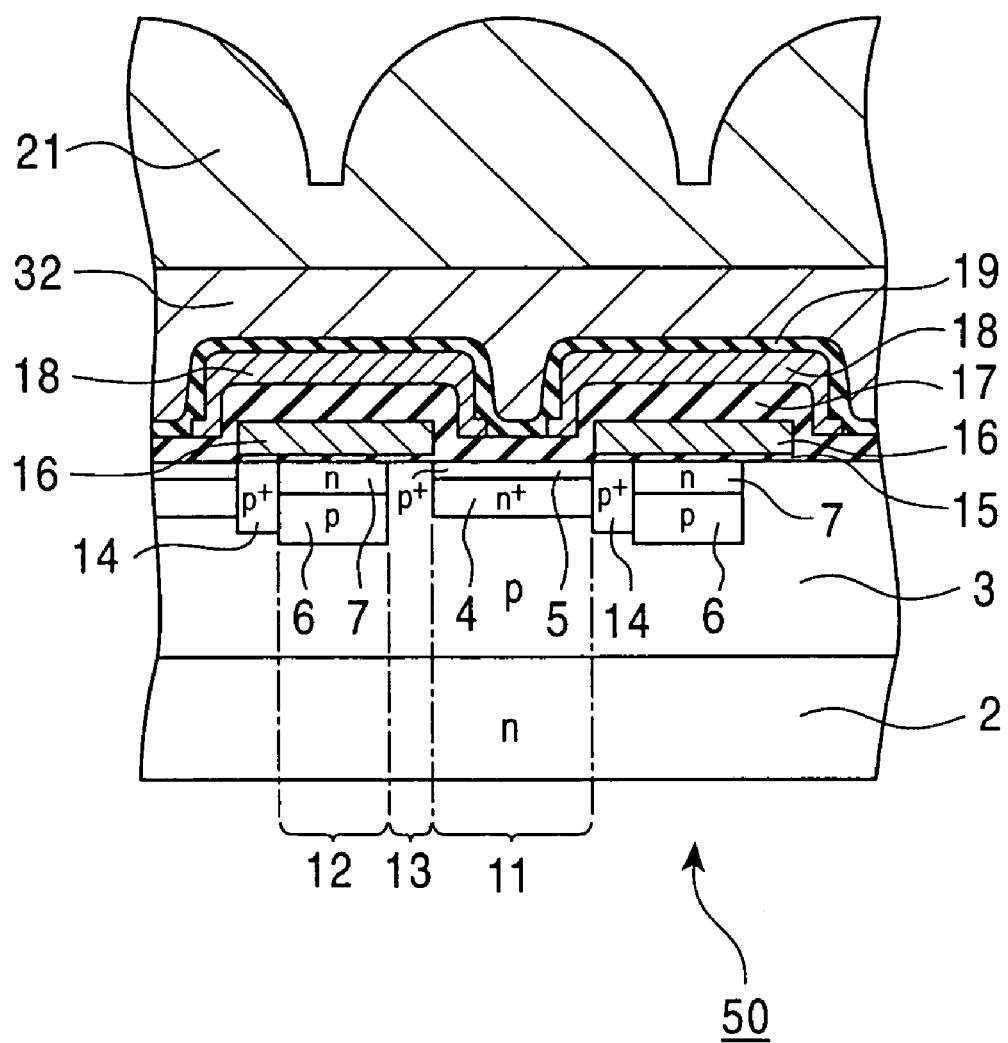
FIG. 6 is a sectional view which schematically shows a portion of a solid-state imaging device in another embodiment of the present invention.

FIG. 6 is a sectional view of a solid-state imaging device which schematically shows a portion in the vicinity of the sensor section in another embodiment of the present invention.

A solid-state imaging device 50 includes a planarizing film 32 composed of an SiO film formed by plasma-enhanced CVD on an insulating film 19, and an on-chip lens 21 composed of an SiN film formed by plasma-enhanced CVD on the planarizing film 32.

Since the other structure is the same as that of the solid-state imaging device 1 shown in FIG. 1, the same numerals are used for the same components, and a description thereof will be omitted.

That is, in this embodiment, since the on-chip lens 21 is composed of the SiN film, the on-chip lens 21 can be used as a passivation film.

Although the SiN film and the SiO film are formed by plasma-enhanced CVD in the individual embodiments described above, ordinary CVD may be used instead of the plasma-enhanced CVD.

By using the plasma-enhanced CVD, films can be formed at a temperature of 300 to 500° C., which is lower than the temperature in the ordinary CVD, and therefore it is possible to use a metal film having a relatively low melting point, such as aluminum, for the shading film.

In the individual embodiments described above, high sensitivity to ultraviolet light is realized by using the SiN film and the SiO film. However, the present invention is not limited to such films, and other inorganic films, such as an $SiO_2$ film, which transmit ultraviolet light may be used.

By forming at least the layer including the on-chip lens above the sensor section using an inorganic film which transmits ultraviolet light, ultraviolet light is allowed to enter the sensor section, and also light is collected by the on-chip lens, thus improving the effective aperture ratio.

Although the present invention is applied to the CCD solid-state imaging device in the embodiments, the present invention is also applicable to other types of solid-state imaging devices having different configurations, such as an MOS solid-state imaging device. In any configuration, by forming an on-chip lens above the sensor section and by forming the layer above the sensor section using an inorganic film which transmits ultraviolet light, the advantages of the present invention can be obtained.

As described above, because of the sensitivity to ultraviolet light, the solid-state imaging device of the present invention is suitable for use, for example, in a microscope in which ultraviolet light is used as a light source.

It is to be understood that the present invention is not limited to the embodiments described above, and various alterations can be made within the scope not deviating from the object of the present invention.

In accordance with the present invention, ultraviolet light is allowed to enter the sensor section and the solid-state imaging device which is sensitive to ultraviolet light can be constructed.

Furthermore, by means of the on-chip lens, the effective aperture ratio at the sensor section is improved, a high quantum efficiency can be achieved, and the sensitivity to ultraviolet light can be increased.

What is claimed is:

1. A solid-state imaging device comprising:
   (a) a sensor including a p-type storage region disposed on an n-type impurity region; and
   (b) a passivation section disposed above the sensor and effective to transmit at least ultraviolet light to the sensor, the passivation section having only
      (1) a single-layer on-chip convex lens comprised of a first SiN film and formed by plasma-enhanced chemical vapor deposition, and
      (2) a planarizing film comprised of a second SiN film and formed by plasma-enhanced chemical vapor deposition and which is disposed directly below the lens and between the lens and the sensor;
   (c) a first insulating film composed of $SiO_2$ and disposed between the planarizing film and a transfer electrode, the first insulating film being common to the transfer electrode and an adjacent transfer electrode;
   (d) a second insulating film disposed between the first insulating film and the transfer electrode, the second insulating film being common to the transfer electrode and the adjacent transfer electrode; and (e) a shading film disposed between the first insulating film and the second insulating film, the shading film extending over a portion of the sensor such that an aperture is created over a portion of the sensor, wherein, the planarizing film is in direct and contiguous contact with the on-chip lens and has a substantially planar top surface and a bottom surface corresponding to a shape of an underlying transfer electrode, the first SiN film has a planar bottom surface that is in contact with and conforms to the substantially planar top surface of the second SiN film in at least a region that overlaps the aperture.

* * * * *